(12) United States Patent  
Kim

(10) Patent No.: US 12,349,566 B2  
(45) Date of Patent: Jul. 1, 2025

(54) DISPLAY PANEL AND DISPLAY DEVICE INCLUDING THE SAME

(71) Applicant: Samsung Display Co., Ltd., Yongin-si (KR)

(72) Inventor: Byoungyong Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 537 days.

(21) Appl. No.: 17/686,869

(22) Filed: Mar. 4, 2022

(65) Prior Publication Data

US 2022/0376023 A1 Nov. 24, 2022

(30) Foreign Application Priority Data

May 20, 2021 (KR) .......................... 10-2021-0064650

(51) Int. Cl.
*H01L 21/78* (2006.01)
*H10K 59/131* (2023.01)
*H10K 71/00* (2023.01)
*H10K 59/12* (2023.01)

(52) U.S. Cl.
CPC ........... H10K 59/131 (2023.02); H10K 71/00 (2023.02); *H10K 59/1201* (2023.02)

(58) Field of Classification Search
CPC .. H10K 59/131; H10K 71/00; H10K 59/1201; H10K 59/1275; H10K 59/129; G02F 1/13458; G02F 1/13452; H05K 1/00; H01L 27/156; H01L 27/124
USPC .......................................................... 257/40
See application file for complete search history.

(56) References Cited

U.S. PATENT DOCUMENTS

| | | | | |
|---|---|---|---|---|
| 5,411,400 | A * | 5/1995 | Subrahmanyan | H01L 24/90 361/636 |
| 5,903,059 | A * | 5/1999 | Bertin | H01L 23/544 257/E23.179 |
| 6,920,689 | B2 * | 7/2005 | Khandros | G01R 3/00 29/870 |
| 7,192,634 | B2 | 3/2007 | Carter et al. | |
| 7,294,731 | B1 | 11/2007 | Flynn et al. | |
| 7,405,295 | B2 * | 7/2008 | Currie | A61P 37/02 544/119 |
| 7,478,920 | B2 * | 1/2009 | Nanbu | G02F 1/133608 362/225 |
| 7,973,310 | B2 | 7/2011 | Wang et al. | |
| 8,313,207 | B2 * | 11/2012 | Kuromizu | G02F 1/133608 362/97.4 |
| 8,482,123 | B2 * | 7/2013 | Grillberger | H01L 23/49811 257/737 |
| 9,338,895 | B2 * | 5/2016 | Clayton | H05K 3/32 |
| 9,627,347 | B2 * | 4/2017 | Aoyagi | H01L 24/11 |
| 9,680,273 | B2 * | 6/2017 | Light | H01R 12/7082 |
| 10,018,863 | B2 * | 7/2018 | Lee | G02F 1/133308 |

(Continued)

FOREIGN PATENT DOCUMENTS

KR 1020190051373 A 5/2019
KR 1020210008277 A 1/2021

*Primary Examiner* — Vu A Vu

(74) *Attorney, Agent, or Firm* — CANTOR COLBURN LLP

(57) ABSTRACT

A display panel includes: a first substrate; and a pad including a first conductive layer and a first coupling part. The first conductive layer is disposed on the first substrate, and the first coupling part includes a first pattern protruding from the first conductive layer and having a bent shape.

18 Claims, 14 Drawing Sheets

(56) References Cited

U.S. PATENT DOCUMENTS

| | | | |
|---|---|---|---|
| 10,564,456 B2* | 2/2020 | Son | G02F 1/133308 |
| 10,903,156 B2* | 1/2021 | Pahl | H01L 23/3185 |
| 11,469,199 B2* | 10/2022 | Goward | H01L 25/0753 |
| 2011/0079349 A1* | 4/2011 | Cho | H05K 3/4682 |
| | | | 156/247 |
| 2013/0093964 A1* | 4/2013 | Kuroda | H04N 5/645 |
| | | | 362/225 |
| 2021/0331456 A1* | 10/2021 | Park | B32B 38/1866 |
| 2022/0181222 A1* | 6/2022 | Endo | H05B 33/14 |

* cited by examiner

DISPLAY PANEL AND DISPLAY DEVICE INCLUDING THE SAME

This application claims priority to Korean Patent Application No. 10-2021-0064650 filed on May 20, 2021, and all the benefits accruing therefrom under 35 U.S.C. § 119, the content of which in its entirety is herein incorporated by reference.

BACKGROUND

1. Field

Embodiments relate to a display panel and a display device including the same.

2. Description of the Related Art

In general, a display device may include a display panel configured to display an image, and a driver configured to drive the display panel. For example, the driver may include an IC driving chip or a printed circuit board ("PCB"). Most of the IC driving chip or the printed circuit board may be mounted on an edge of the display panel. For example, the IC driving chip may be directly mounted on the display panel through an anisotropic conductive film ("ACF") by a chip-on-glass ("COG") scheme or a chip-on-plastic ("COP") scheme. The IC driving chip may be mounted on a tape carrier package ("TCP") scheme or a printed circuit board (chip-on-film, "COF") scheme, and the IC driving chip may be connected to the display panel through the anisotropic conductive film.

Resolution of the display device has become higher, an area of a non-display region of the display device has been reduced, and a width and an interval of wires have been reduced. Therefore, since the area of the non-display region of the display device has to be reduced, a distance between pads included in the display panel and a distance between electrodes included in the driver may be reduced.

SUMMARY

When the driver is attached to the display panel with the anisotropic conductive film, a short may occur between conductive particles included in the anisotropic conductive film.

One aspect of the present disclosure is to provide a display panel with improved display quality.

Another aspect of the present disclosure is to provide a display device including the display panel.

A display panel according to an embodiment includes: a first substrate; and a pad including a first conductive layer and a first coupling part. The first conductive layer is disposed on the first substrate, and the first coupling part includes a first pattern protruding from the first conductive layer and having a bent shape.

In an embodiment, the first pattern may include a first sub-pattern protruding from the first conductive layer and a second sub-pattern bent from the first sub-pattern.

In an embodiment, the first coupling part may further include a support pattern disposed between the first pattern and the first conductive layer.

In an embodiment, a side surface of the support pattern may be located inward compared to a side surface of the second sub-pattern.

In an embodiment, the first coupling part may further include a conductive pattern disposed on the first pattern.

In an embodiment, the first pattern may include an insulating material.

In an embodiment, the first pattern may include a plurality of layers which are stacked.

A display device according to an embodiment includes: a display panel including a first substrate, and a pad, where the pad includes a first conductive layer disposed on the first substrate, and a first coupling part including a first pattern protruding from the first conductive layer and having a bent shape; a driver disposed on the display panel and including a second substrate facing the first substrate and an electrode, where the electrode includes a second conductive layer disposed under the second substrate, and a second coupling part including a second pattern protruding from the second conductive layer and having a bent shape and a resin layer disposed between the display panel and the driver.

In an embodiment, the first pattern may include a first sub-pattern protruding from the first conductive layer and a second sub-pattern bent from the first sub-pattern.

In an embodiment, the first coupling part may further include a support pattern disposed between the first pattern and the first conductive layer.

In an embodiment, a side surface of the support pattern may be located inward compared to a side surface of the second sub-pattern.

In an embodiment, the second pattern may include a third sub-pattern protruding from the second conductive layer and a fourth sub-pattern bent from the third sub-pattern.

In an embodiment, the first coupling part may further include a conductive pattern disposed on the first pattern.

In an embodiment, a sum of a thickness of the second sub-pattern and a thickness of the conductive pattern may be less than or equal to a distance between the second conductive layer and the fourth sub-pattern in a thickness direction.

In an embodiment, a thickness of the fourth sub-pattern may be less than or equal to a distance between the first conductive layer and the second sub-pattern in the thickness direction.

In an embodiment, the first coupling part may make contact with the second conductive layer.

In an embodiment, the second coupling part may make contact with the first conductive layer.

In an embodiment, the driver may include an IC driving chip.

In an embodiment, the driver may include a printed circuit board.

In an embodiment, the resin layer may include an insulating material.

However, aspects of the present disclosure are not limited to the above-described aspects, and may be variously extended without departing from the idea and scope of the present disclosure.

According to the display device of embodiments of the present disclosure, the electrode included in the driver and the pad included in the display panel may make direct contact with each other. The first coupling part included in the pad and the second coupling part included in the electrode may be coupled to each other. Therefore, conductive particles may not be disposed in the resin layer disposed between the driver and the display panel. Since the resin layer does not include the conductive particles, a short may not be caused by the resin layer. In addition, since the resin layer included in the display device does not include the conductive particles, a manufacturing cost of the display device can be reduced.

However, effects of the present disclosure are not limited to the above-described effects, and may be variously extended without departing from the idea and scope of the present disclosure.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Figure 1:
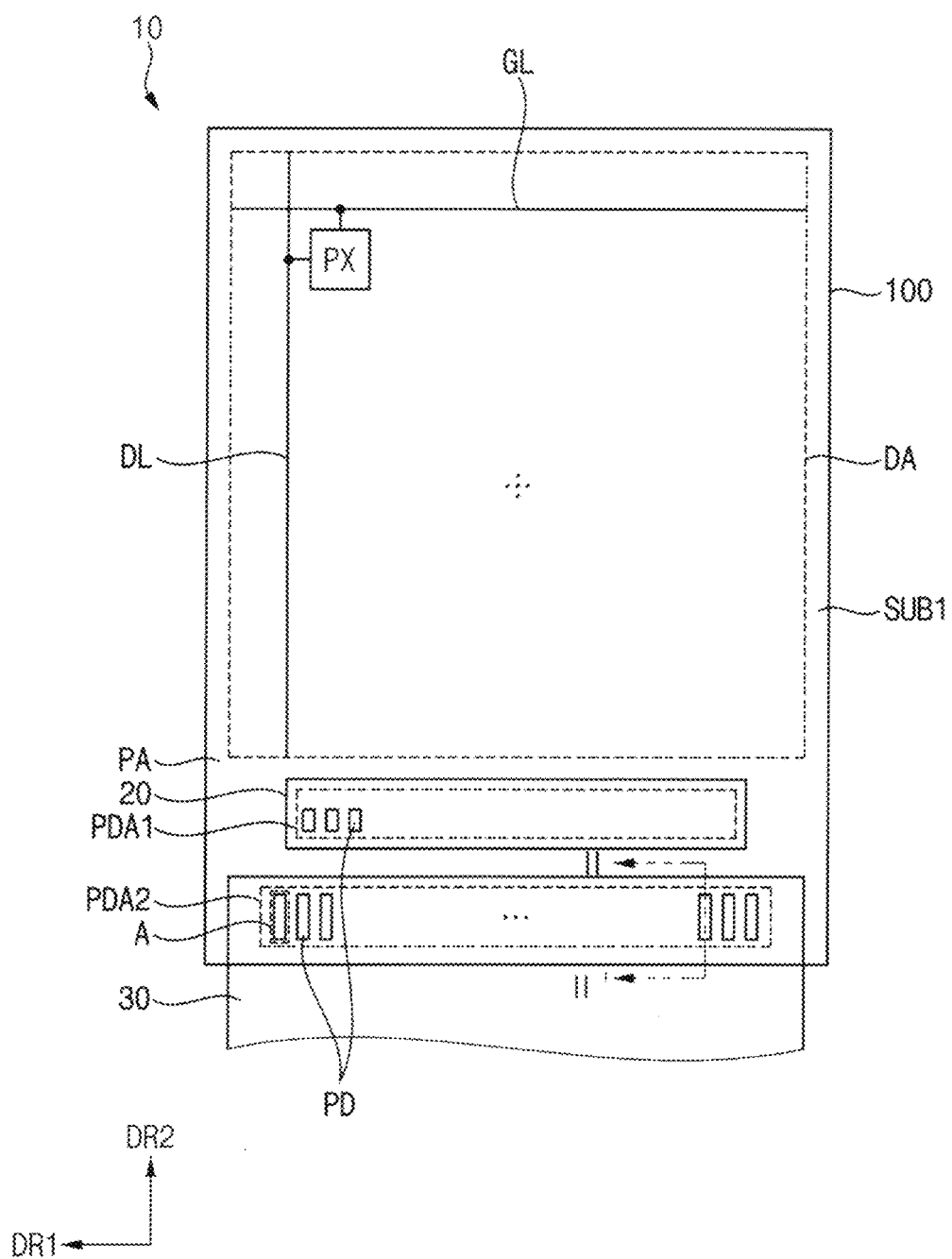
FIG. 1 is a plan view showing a display device according to embodiments of the present disclosure.

FIG. 1 is a plan view showing a display device according to embodiments of the present disclosure.

Referring to FIG. 1, according to embodiments of the present disclosure, a display device 10 may include a display panel 100 including a display area DA and a peripheral area PA. The display area DA may be an area in which an image is displayed, and the peripheral area PA may be located at an edge of the display area DA.

A pixel structure PX and data and gate lines DL and GL connected to the pixel structure PX may be disposed in the display area DA. The pixel structure PX may include a transistor and a light emitting diode. The gate line GL may be connected to a gate driver, and may extend in a first direction DR1. The data line DL may be electrically connected to a data driver, and may extend in a second direction DR2 intersecting the first direction DR1.

Wires, pads PD, and a driving circuit part configured to transmit electrical signals to the display area DA may be located in the peripheral area PA. The pads PD may receive an external signal for allowing the light emitting diode to emit light by transmitting the received external signal to the light emitting diode.

A first pad part PDA1 and a second pad part PDA2 may be located in the peripheral area PA. The first pad part PDA1 and the second pad part PDA2 may be spaced apart from each other. The first pad part PDA1 may be located between the display area DA and the second pad part PDA2.

Each of the first pad part PDA1 and the second pad part PDA2 may include pads PD.

A driver may be connected to each of the first pad part PDA1 and the second pad part PDA2. For example, an IC driving chip 20 may be connected to the first pad part PDA1, and a printed circuit board 30 may be connected to the second pad part PDA2. The IC driving chip 20 may be an integrated circuit chip.

According to embodiments, the IC driving chip 20 may be mounted in the peripheral area PA by a chip-on-glass (COG) scheme or a chip-on-plastic (COP) scheme so as to be electrically connected to a plurality of pads PD. However, embodiments of the present disclosure are not limited to the above configuration. According to another embodiment, the IC driving chip 20 may be mounted on the printed circuit board 30 by a chip-on-film (COF) scheme.

The printed circuit board 30 may be a circuit board configured to supply a driving signal to the display device 10. The printed circuit board 30 may include a timing controller and a power supply voltage generator. The timing controller may generate a control signal for driving the display device 10. The power supply voltage generator may generate a power supply voltage.

Each of the IC driving chip 20 and the printed circuit board 30 may include electrodes. The electrodes of the IC driving chip 20 may be connected to the pads PD of the first pad part PDA1. The IC driving chip 20 and the first pad part PDA1 may be connected to each other to control light emission of the light emitting diode. The electrodes of the printed circuit board 30 may be connected to the pads PD of the second pad part PDA2. The printed circuit board 30 and the second pad part PDA2 may be connected to each other so that the printed circuit board 30 may supply the driving signal to the display device 10.

Each of the first pad part PDA1 and the second pad part PDA2 may be connected to a wire part. The wire part may include wires configured to connect the first pad part PDA1 and the second pad part PDA2 to each other. The wire part may receive a signal from the second pad part PDA2, and transmit the signal to the first pad part PDA1. In other words, the driving signal may be supplied to the display device 10 through the printed circuit board 30, the second pad part PDA2, the wire part, and the first pad part PDA1.

The display area DA may display an image based on the driving signal applied to a plurality of pixel structures PX disposed on the display panel 100. The pixel structures PX may be disposed in a matrix form in the first direction DR1 and the second direction DR2.

Although the display panel 100 has been shown in the drawings as having a rectangular shape, according to another embodiment, a width of one side of the display panel 100 may be narrower than a width of another side of the display panel 100 crossing the one side. For example, the display panel 100 may include a bending part, a first non-bending part, and a second non-bending part. The display area DA may be located in the first non-bending part. The first pad part PDA1 and the second pad part PDA2 may be located in the second non-bending part. The bending part may be located between the first non-bending part and the second non-bending part. In an embodiment, a width of the bending part in the first direction DR1 may be smaller than a width of the first non-bending part in the first direction DR1. In addition, a width of the second non-bending part in the first direction DR1 may be smaller than the width of the first non-bending part in the first direction DR1. The width of the bending part in the first direction DR1 may be substantially equal to the width of the second non-bending part in the first direction DR1.

Figure 2:
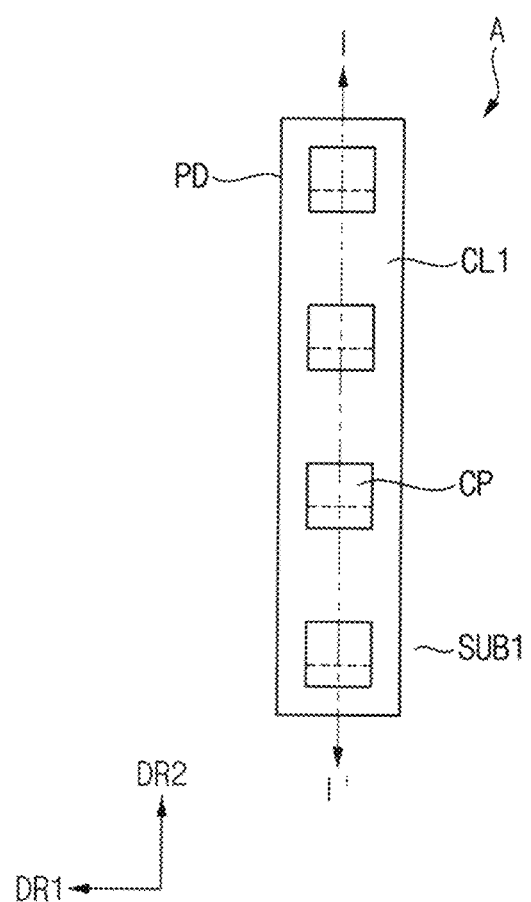
FIG. 2 is an enlarged plan view showing a region A of FIG. 1.
Figure 3:
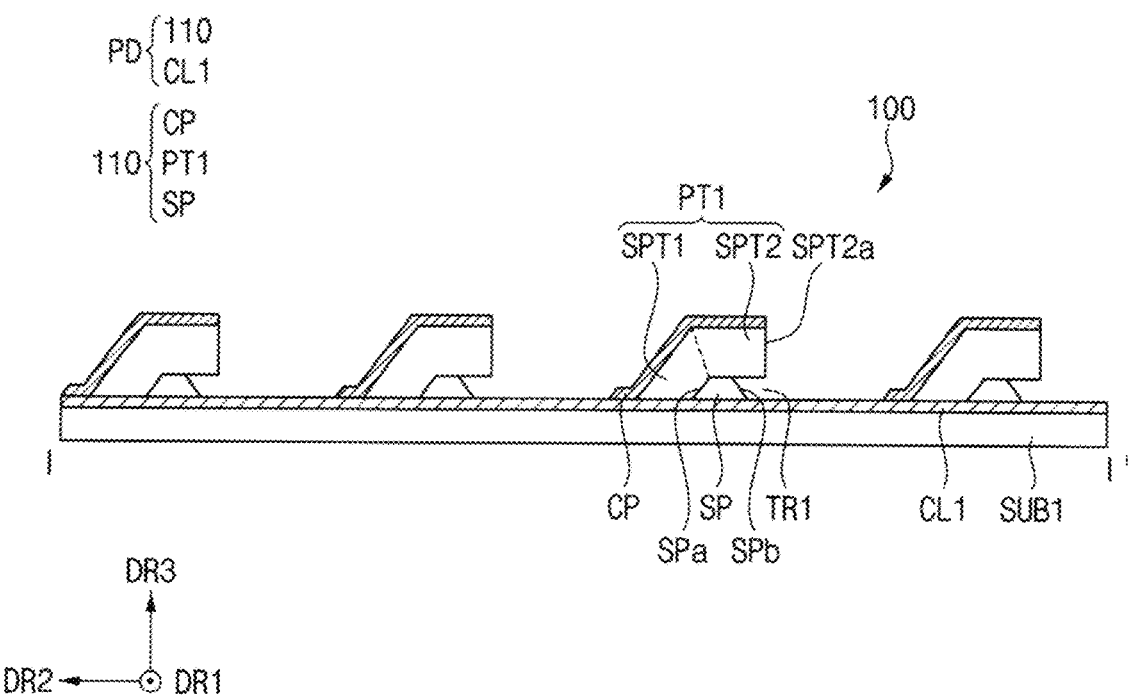
FIG. 3 is a sectional view taken along line I-I' of FIG. 2.

FIG. 2 is an enlarged plan view showing a region A of FIG. 1. FIG. 3 is a sectional view taken along line I-I' of FIG. 2.

Referring to FIGS. 1 to 3, according to embodiments, the display panel 100 may include a first substrate SUB1 and a pad PD.

The first substrate SUB1 may be formed of or include a transparent glass material including $SiO_2$ as a main component. However, the first substrate SUB1 is not necessarily limited to the above configuration, and may be formed of or include a transparent plastic material. The plastic material constituting the first substrate SUB1 may include polyethersulfone ("PES"), polyarylate ("PAR"), polyetherimide ("PEI"), polyethylene naphthalate ("PEN"), polyethylene terephthalate ("PET"), polyphenylene sulfide ("PPS"), polyimide, polycarbonate ("PC"), cellulose triacetate (TAC), or cellulose acetate propionate (CAP). The above materials may be used alone or in combination with each other.

According to embodiments, the pad PD may include a first conductive layer CL1 and at least one first coupling part 110. The first conductive layer CL1 may be disposed on the first substrate SUB1. The first conductive layer CL1 may include a conductive material. For example, the first conductive layer CL1 may include a metal.

The first coupling parts 110 may be arranged at regular intervals from each other. For example, the first coupling parts 110 may be arranged along one row extending in the second direction DR2.

According to embodiments, the first coupling part 110 may include a first pattern PT1, a support pattern SP, and a conductive pattern CP.

The support pattern SP may be disposed on the first conductive layer CL1. The first pattern PT1 may protrude from the first conductive layer CL1 in a third direction DR3 (i.e., a thickness direction of the first substrate SUB1). The conductive pattern CP may be disposed on the first pattern PT1.

The first pattern PT1 may have a bent shape. In detail, the first pattern PT1 may include a first sub-pattern SPT1 and a second sub-pattern SPT2. The first sub-pattern SPT1 and the second sub-pattern SPT2 may be directly connected to each other. The first sub-pattern SPT1 and the second sub-pattern SPT2 may be formed integrally with each other. The first sub-pattern SPT1 may be a portion of the first pattern PT1 that protrudes from the first conductive layer CL1 in an inclined direction from a major surface plane of the first substrate SUB1 which is defined by the first direction DR1 and the second direction DR2. The second sub-pattern SPT2 may be a portion of the first patterns PT1 that is bent from the first sub-pattern SPT1. However, the embodiments according to the present disclosure are not limited to the above configuration. According to another embodiment, the first pattern PT1 may have a shape other than the bent shape.

The first pattern PT1 may include an insulating material. However, the embodiments according to the present disclosure are not limited to the above configuration, and the first pattern PT1 may further include a conductive material.

The first pattern PT1 may be disposed on the support pattern SP. A first side surface SPa of the support pattern SP may make contact with the first sub-pattern SPT1. A top surface of the support pattern SP may make contact with the second sub-pattern SPT2. In other words, the support pattern SP may support the first pattern PT1. In addition, the support pattern SP may be configured to define a first trench TR1 between the first pattern PT1 and the first conductive layer CL1. That is, the support pattern SP, the first pattern PT1 and the first conductive layer CL1 may define the first trench TR1.

A second side surface SPb of the support pattern SP may be located inward in the second direction DR2 compared to a side surface SPT2a of the second sub-pattern SPT2 parallel to a plane defined by the first direction DR1 and the third direction DR3. Therefore, the first trench TR1 may be defined between the second sub-pattern SPT2 and the first conductive layer CL1.

The conductive pattern CP may be disposed on the first pattern PT1. The conductive pattern CP may cover a top surface of the first pattern PT1. The conductive pattern CP may include a conductive material. For example, the conductive pattern CP may include a metal.

One end of the conductive pattern CP may make contact with the first conductive layer CL1. Therefore, a signal provided to the conductive pattern CP may be transmitted to the first conductive layer CL1.

Figure 4:
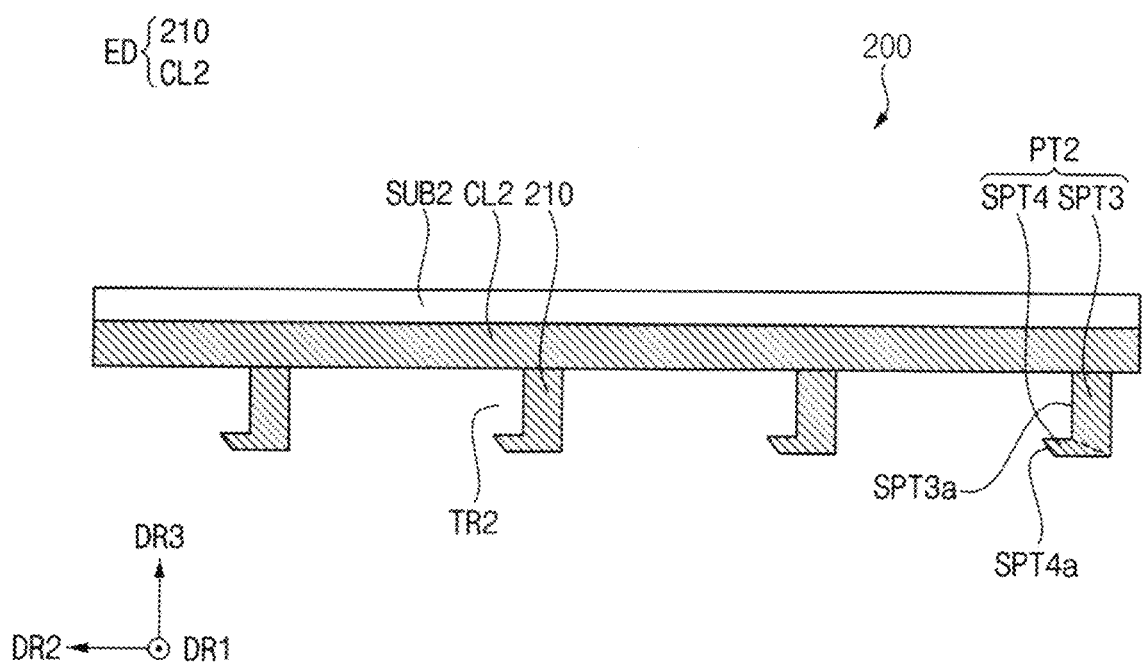
FIG. 4 is a sectional view showing one example of a driver included in the display device of FIG. 1.

FIG. 4 is a sectional view showing one example of a driver included in the display device of FIG. 1.

Referring to FIGS. 1, 2, and 4, according to embodiments, the display device 10 may include a driver 200. The driver 200 may be disposed on the display panel 100. The driver 200 may be connected to the display panel 100.

According to embodiments, the driver 200 may be the IC driving chip 20. The IC driving chip 20 may be connected to the first pad part PDA1.

According to embodiments, the driver 200 may be the printed circuit board 30. The printed circuit board 30 may be connected to the second pad part PDA2. An IC driving chip may be mounted on the printed circuit board 30.

The driver 200 may include a second substrate SUB2 and an electrode ED. The second substrate SUB2 may face the first substrate SUB1. The electrode ED may be disposed under the second substrate SUB2. The electrode ED may be coupled to the second substrate SUB2.

The electrode ED may include a second conductive layer CL2 and at least one second coupling part 210. According to embodiments, the second conductive layer CL2 and the second coupling part 210 may be formed integrally with each other. The second conductive layer CL2 may be disposed under the second substrate SUB2. The second conductive layer CL2 may include a conductive material. For example, the second conductive layer CL2 may include a metal.

The second coupling parts 210 may be arranged at regular intervals from each other.

According to embodiments, the second coupling part 210 may include a second pattern PT2. The second pattern PT2 may protrude from the second conductive layer CL2 in the direction opposite to the third direction DR3, and may have a bent shape. In detail, the second pattern PT2 may include a third sub-pattern SPT3 and a fourth sub-pattern SPT4. The third sub-pattern SPT3 and the fourth sub-pattern SPT4 may be formed integrally with each other. The third sub-pattern SPT3 may be a portion of the second pattern PT2 that protrudes from the second conductive layer CL2 in the direction opposite to the third direction DR3. The fourth sub-pattern SPT4 may be a bent portion of the second pattern PT2. However, the embodiments according to the present disclosure are not limited to the above configuration. According to another embodiment, the second pattern PT2 may have a shape other than the bent shape.

The second pattern PT2 may include a conductive material. For example, the second pattern PT2 may include a metal. Therefore, the second pattern PT2 may have conductivity.

A first side surface SPT3a of the third sub-pattern SPT3 may be located inward in the direction opposite to the second direction DR2 compared to a first side surface SPT4a of the fourth sub-pattern SPT4. Therefore, a second trench TR2 may be defined between the fourth sub-pattern SPT4 and the second conductive layer CL2.

Figure 5:
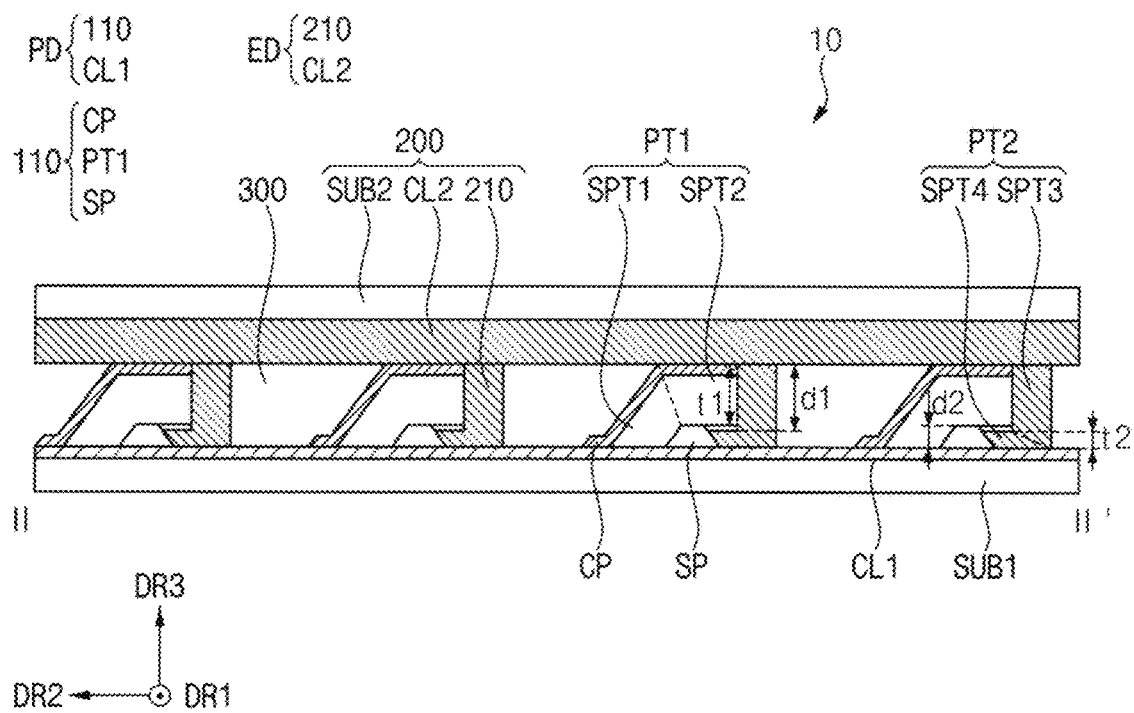
FIG. 5 is a sectional view taken along line II-II' in the display device of FIG. 1.

FIG. 5 is a sectional view taken along line II-IF in the display device of FIG. 1.

Referring to FIGS. 1 to 5, the fourth sub-pattern SPT4 may be disposed in the first trench TR1 between the second sub-pattern SPT2 and the first conductive layer CL1. Similarly, the second sub-pattern SPT2 and the conductive pattern CP may be disposed in the second trench TR2 between the fourth sub-pattern SPT4 and the second conductive layer CL2. In other words, the first coupling part 110 and the second coupling part 210 may be coupled to each other. Bent portions of the first coupling part 110 and the second coupling part 210 may be coupled to the trenches TR2 and TR1 of the second coupling part 210 and the first coupling part 110, respectively, so that coupling strength between the pad PD and the electrode ED may become stronger.

The first coupling part 110 may make contact with the second conductive layer CL2. In detail, the conductive pattern CP included in the first coupling part 110 may make contact with the second conductive layer CL2. Since the conductive pattern CP and the second conductive layer CL2 have conductivity, the conductive pattern CP and the second conductive layer CL2 may be electrically connected to each other. Therefore, a signal provided to the second conductive layer CL2 may be provided to the conductive pattern CP. In addition, since the conductive pattern CP also makes contact with the first conductive layer CL1, the signal provided to the conductive pattern CP may be provided to the first conductive layer CL1.

The second coupling part 210 may make contact with the first conductive layer CL1. Since the second coupling part 210 and the first conductive layer CL1 have conductivity, the second coupling part 210 and the first conductive layer CL1 may be electrically connected to each other. Therefore, a signal provided to the second coupling part 210 may be provided to the first conductive layer CL1. Accordingly, a signal provided to the driver 200 including the electrode ED may be provided to the display panel 100 including the pad PD.

A first thickness t1, which is a sum of a thickness of the second sub-pattern SPT2 and a thickness of the conductive pattern CP, in the third direction DR3 may be less than or equal to a distance d1 between the second conductive layer CL2 and the fourth sub-pattern SPT4 in the third direction DR3. In other words, the first thickness t1 may be less than or equal to a thickness d1 of the second trench TR2 in the third direction DR3. Therefore, the first coupling part 110 may be located in the second trench TR2, and the first coupling part 110 and the second coupling part 210 may be coupled to each other.

A second thickness t2 of the fourth sub-pattern SPT4 in the third direction DR3 may be less than or equal to a distance d2 between the first conductive layer CL1 and the second sub-pattern SPT2 in the third direction DR3. In other words, the second thickness t2 may be less than or equal to a thickness d2 of the first trench TR1 in the third direction DR3. Therefore, the second coupling part 210 may be located in the first trench TR1, and the second coupling part 210 and the first coupling part 110 may be coupled to each other.

According to embodiments, the display device 10 may further include a resin layer 300. The resin layer 300 may be disposed between the display panel 100 and the driver 200. The resin layer 300 may couple the display panel 100 to the driver 200.

The resin layer 300 may include an insulating material. The insulating material constituting the resin layer 300 may include polyimide, polyethylene terephthalate, nylon 6, polyvinylidene fluoride, polycarbonate, polybutylene succinate, polyethylene, or the like. The above materials may be used alone or in combination with each other.

According to embodiments, the pad PD and the electrode ED included in the display device 10 may include the first coupling part 110 and the second coupling part 210, respectively, so that the coupling between the pad PD and the electrode ED may become stronger.

According to a conventional display device, a resin layer may be disposed between a display panel and a driver. The resin layer may include conductive particles. A pad included in the display panel and an electrode included in the driver may be electrically connected to each other through the conductive particles.

However, according to an embodiment of the present disclosure, the first trench TR1 of the first coupling part 110 may be coupled to the fourth sub-pattern SPT4 of the second coupling part 210, and the second trench TR2 of the second coupling part 210 may be coupled to the second sub-pattern SPT2 and the conductive pattern CP of the first coupling part 110, so that the pad PD and the electrode ED may make direct contact with each other. Therefore, an embodiment of the present disclosure may include the resin layer 300 that does not include conductive particles. Since the resin layer 300 does not include conductive particles, a short may not be caused by the resin layer 300. In addition, since the resin layer 300 included in the display device 10 does not include the conductive particles, a manufacturing cost of the display device 10 may be effectively reduced.

Figure 6:
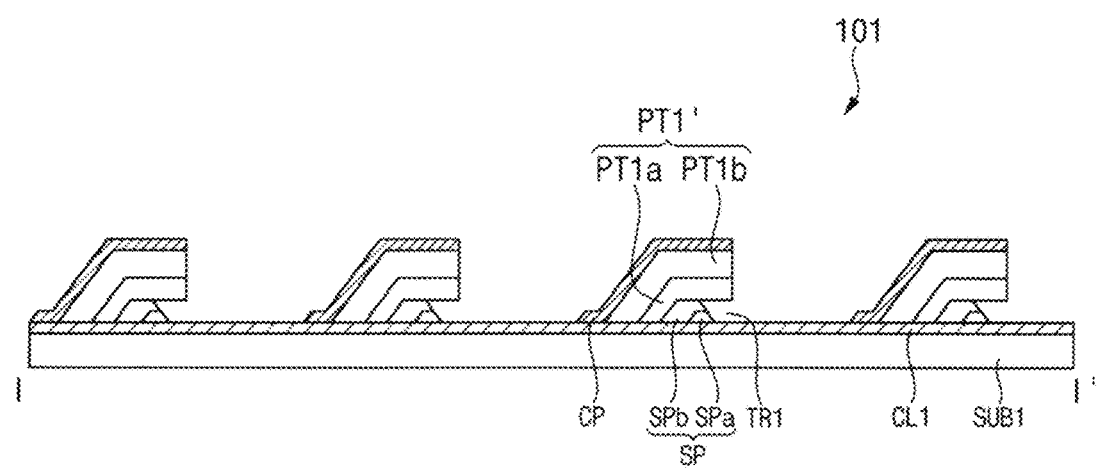
FIG. 6 is a sectional view showing another example of a display panel included in the display device of FIG. 1.

FIG. 6 is a sectional view showing another example of a display panel included in the display device of FIG. 1.

An explanation of a configuration of a display panel 101 of FIG. 6 that is identical to the configuration of the display panel 100 described with reference to FIGS. 1 to 5 will be omitted below.

Referring to FIG. 6, a first pattern PT1' may include a plurality of layers that are stacked. For example, the first pattern PT1' may include a first layer PT1a and a second layer PT1b. The first layer PT1a may be disposed on a first side surface and a top surface of the support pattern SP. The second layer PT1b may be disposed on the first layer PT1a.

The first layer PT1a may include an inorganic insulating material or an organic insulating material. The organic insulating material constituting the first layer PT1a may include an acryl-based resin, an epoxy resin, a phenolic resin, a polyamide-based resin, a polyimide-based resin, an unsaturated polyester-based resin, a polyphenylene-based resin, a polyphenylene sulfide-based resin, benzocyclobutene ("BCB"), or the like.

The second layer PT1b may include an inorganic insulating material or an organic insulating material. The organic insulating material constituting the second layer PT1b may include an acryl-based resin, an epoxy resin, a phenolic resin, a polyamide-based resin, a polyimide-based resin, an unsaturated polyester-based resin, a polyphenylene-based resin, a polyphenylene sulfide-based resin, benzocyclobutene (BCB), or the like.

In an embodiment, the first layer PT1a and the second layer PT1b may include the same material. However, according to another embodiment, the first layer PT1a and the second layer PT1b may include mutually different materials.

In addition, although not shown, the first pattern PT1' may include a conductive layer between the first layer PT1a and the second layer PT1b. The conductive layer may include a conductive material.

The support pattern SP may include a plurality of layers that are stacked. For example, the support pattern SP may include a first support layer SPa and a second support layer SPb. The first support layer SPa may be disposed on the first conductive layer CL1. The second support layer SPb may be disposed on the first support layer SPa.

Figure 7:
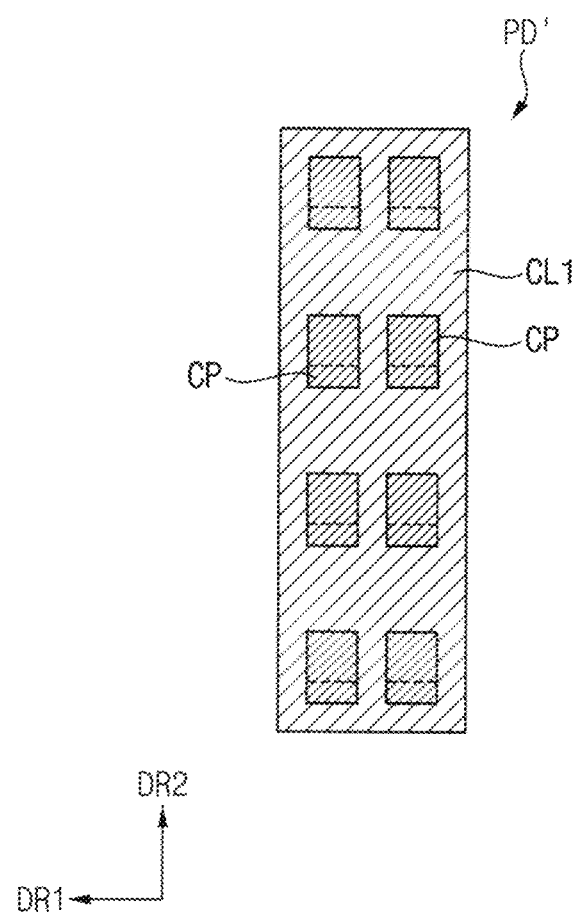
FIG. 7 is a plan view showing another example of a pad included in the display device of FIG. 1.

FIG. 7 is a plan view showing another example of a pad included in the display device of FIG. 1.

Referring to FIG. 7, according to embodiments, a pad PD' may include a first conductive layer CL1 and at least one first coupling part 110. The first coupling parts 110 including the conductive pattern CP may be arranged at regular intervals from each other. For example, the first coupling parts 110 may be arranged along two columns each extending in the second direction DR2. The two columns may be spaced apart from each other in the first direction DR1.

FIGS. 8 to 23 are views for describing a method of manufacturing a display device according to embodiments of the present disclosure.

Figure 8:
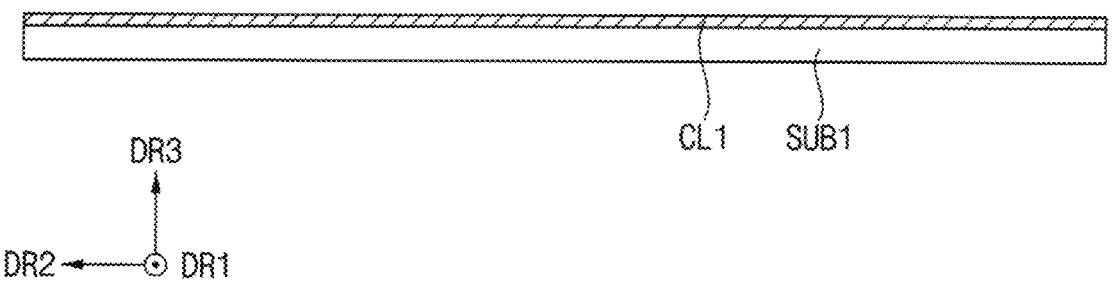
FIGS. 8 to 23 are views for describing a method of manufacturing a display device according to embodiments of the present disclosure.
Figure 9:
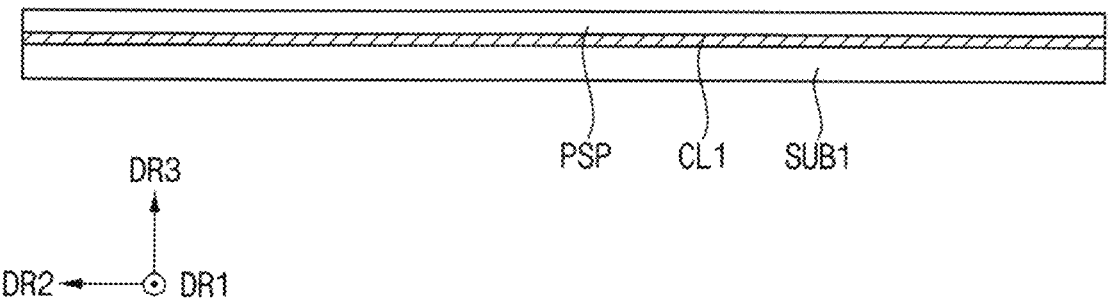
Figure 10:
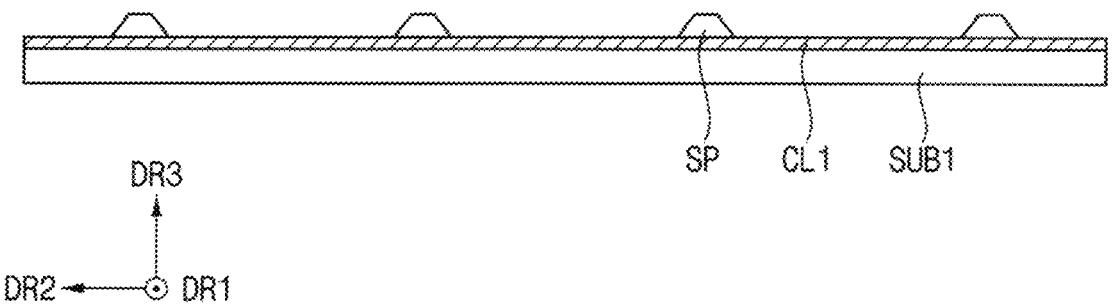

Referring to FIGS. 8 to 10, a first substrate SUB1 may be provided. A first conductive layer CL1 may be formed on the first substrate SUB1. Referring to FIGS. 9 and 10, a preliminary support layer PSP may be formed on the first conductive layer CL1. The preliminary support layer PSP may be patterned to form a support pattern SP.

Figure 11:
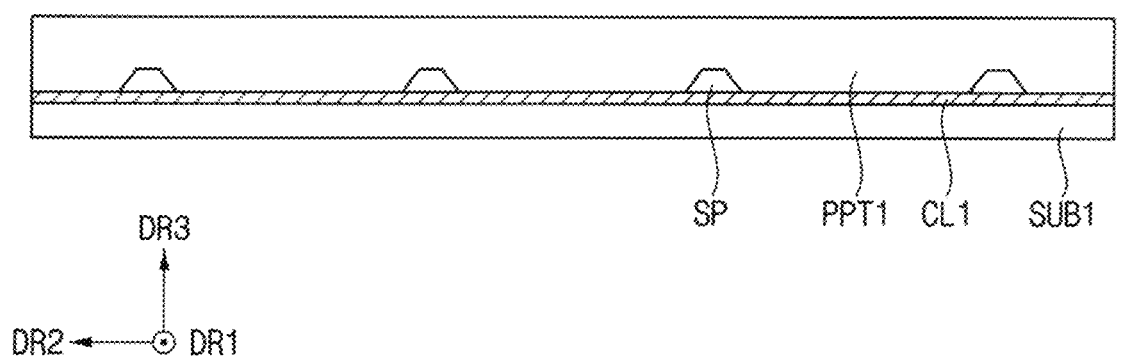
Figure 12:
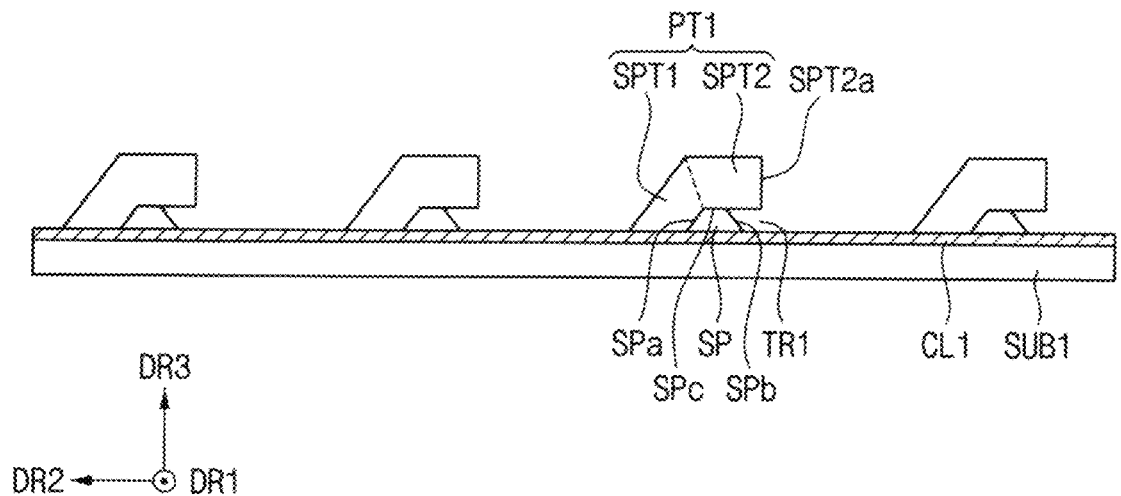

Referring to FIGS. 11 and 12, a first preliminary pattern PPT1 may be formed on the first conductive layer CL1 to cover the support pattern SP. The first preliminary pattern PPT1 may be patterned to form a first pattern PT1. A bottom surface of the first pattern PT1 may make contact with a first side surface SPa and a top surface SPc of the support pattern SP. The bottom surface of the first pattern PT1 may not make contact with a second side surface SPb of the support pattern SP. The first pattern PT1 may include a first sub-pattern SPT1 protruding from the first conductive layer CL1, and a second sub-pattern SPT2 bent from the first sub-pattern SPT1 and extending in a direction opposite to the second direction DR2.

In detail, a portion of the first preliminary pattern PPT1 that is adjacent to the second side surface SPb of the support pattern SP may be etched. Therefore, the support pattern SP and the first pattern PT1 may form an undercut structure. In other words, the second side surface SPb of the support pattern SP may be located inward in the second direction DR2 compared to a side surface SPT2a of the second sub-pattern SPT2 parallel to the plane defined by the first direction DR1 and the third direction DR3. Accordingly, a first trench TR1 may be defined between the second sub-pattern SPT2 and the first conductive layer CL1.

Figure 13:
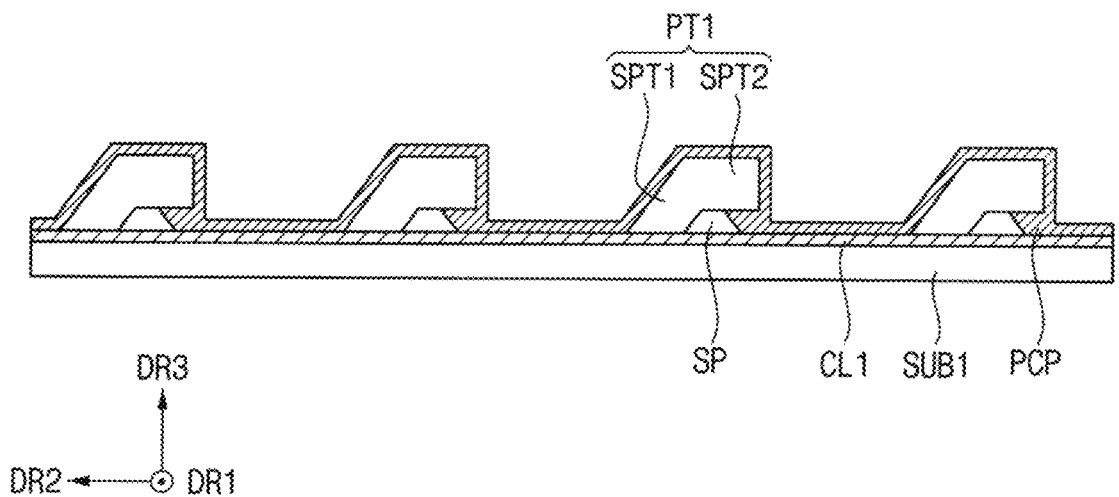
Figure 14:
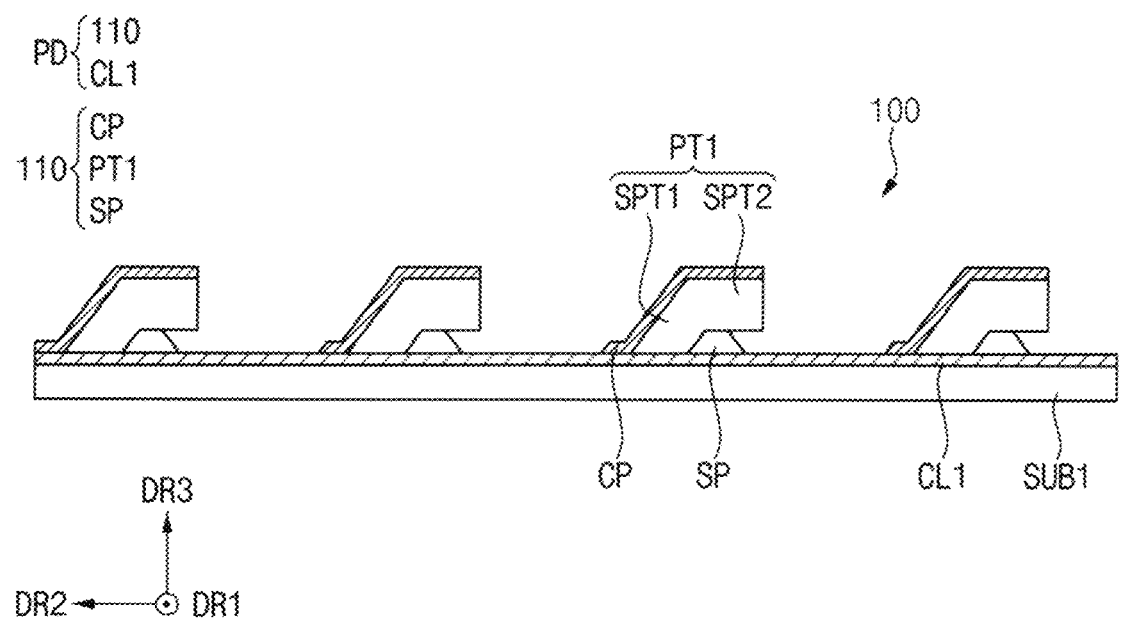
Figure 15:
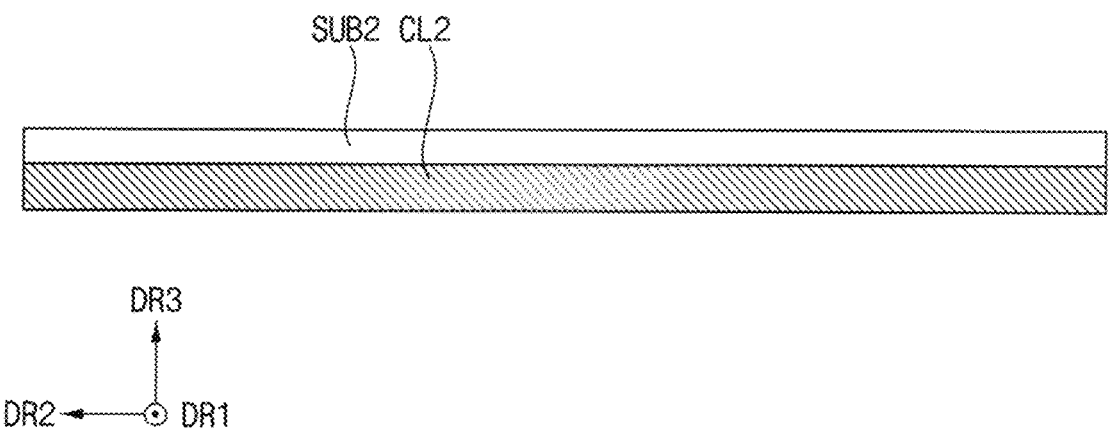
Figure 16:
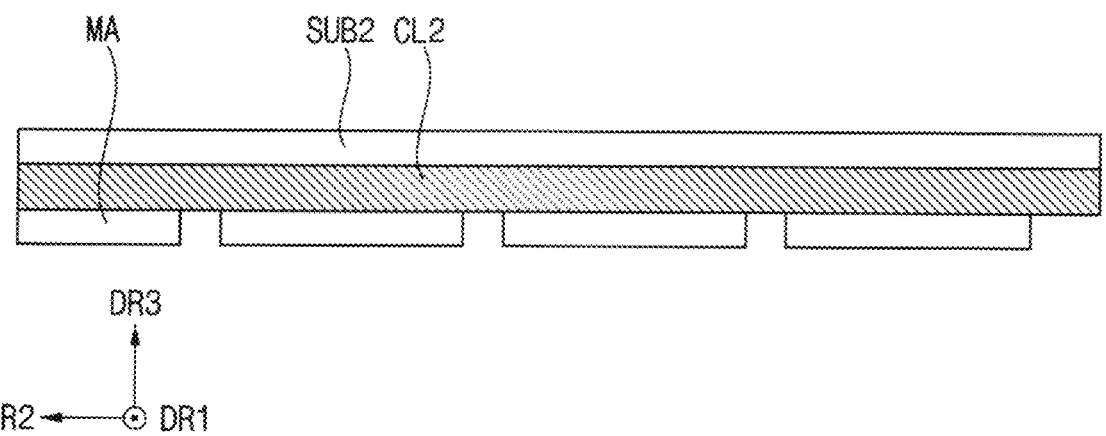
Figure 17:
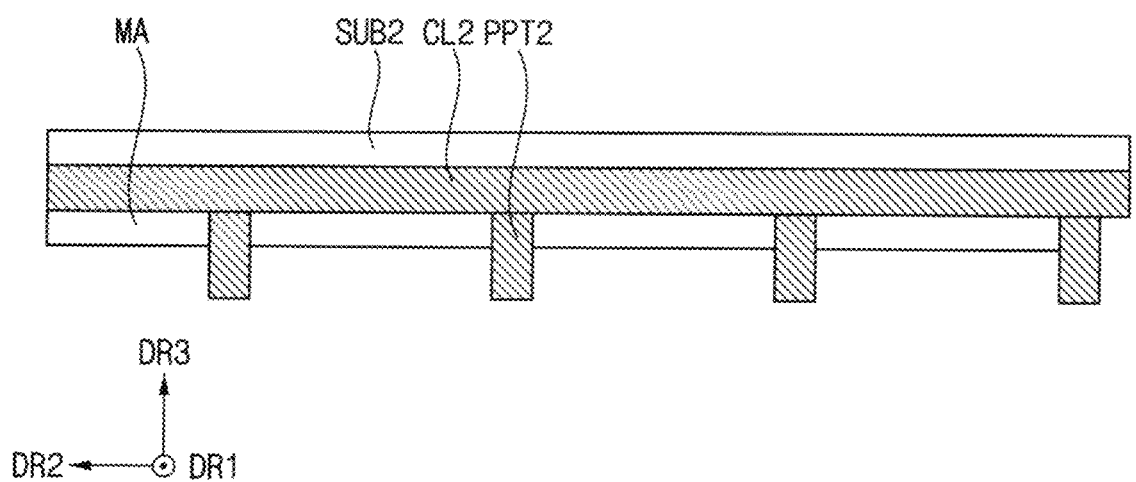
Figure 18:
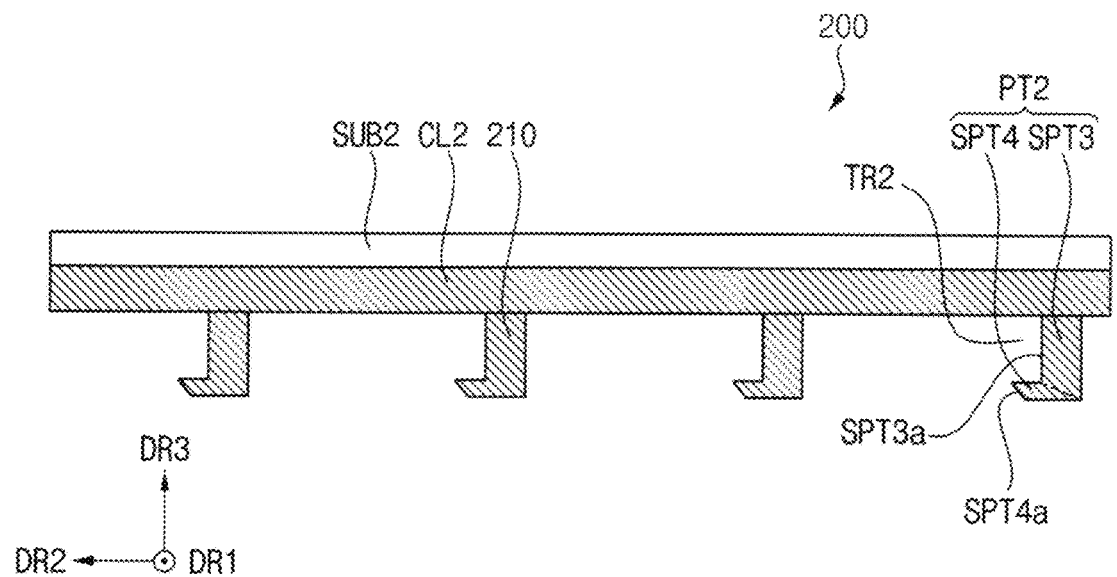
Figure 19:
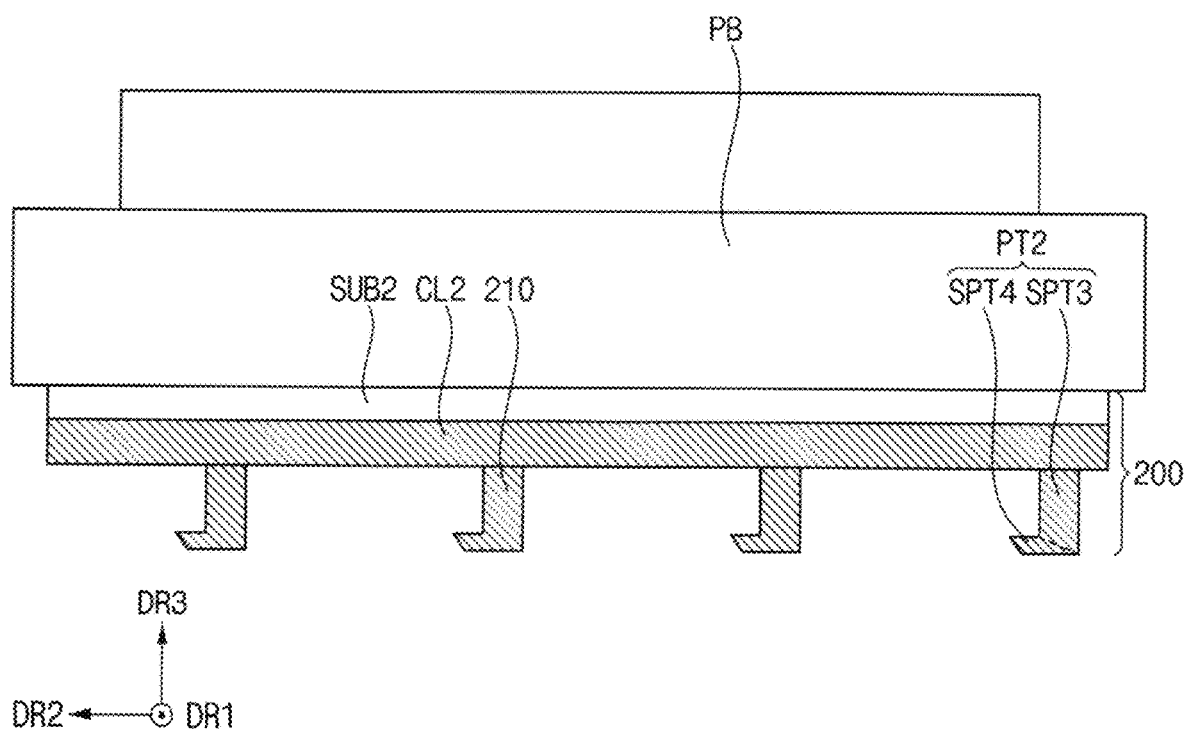
Figure 20:
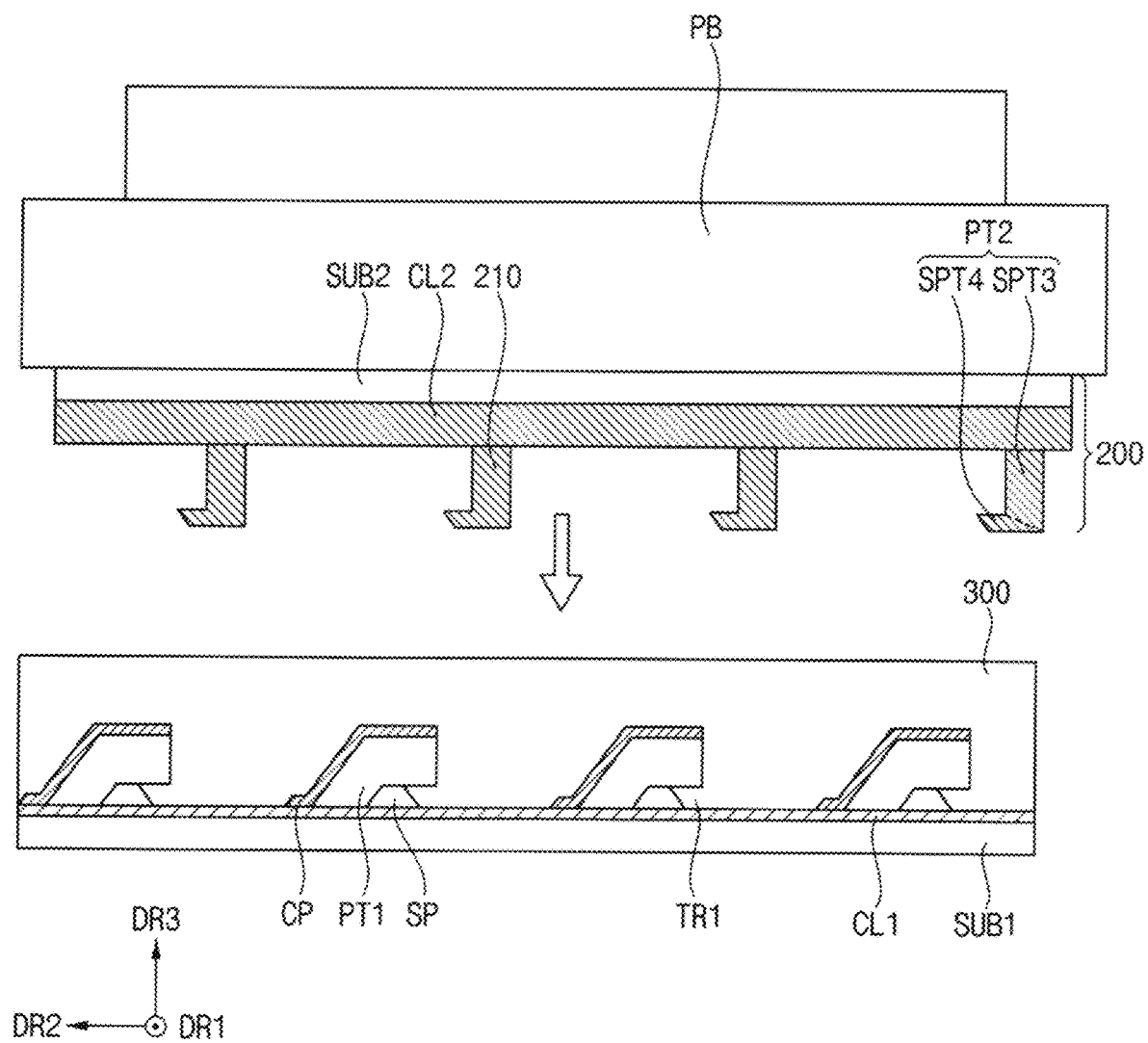
Figure 21:
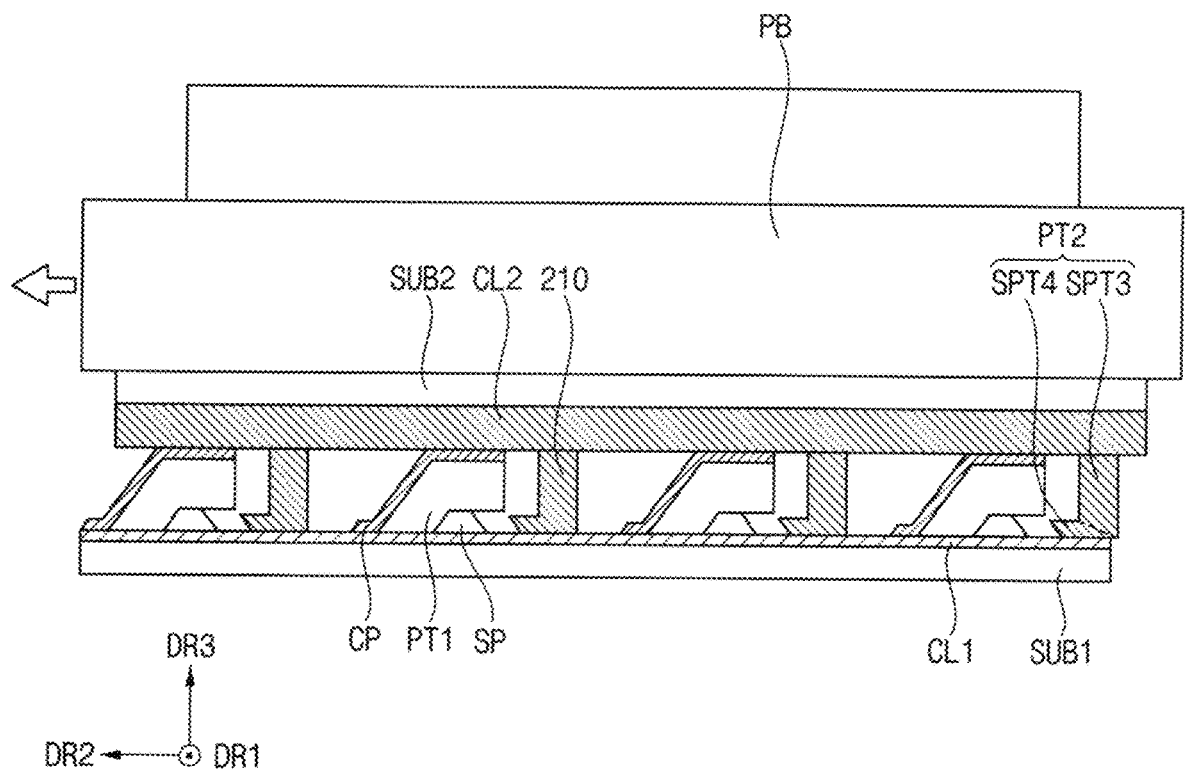
Figure 22:
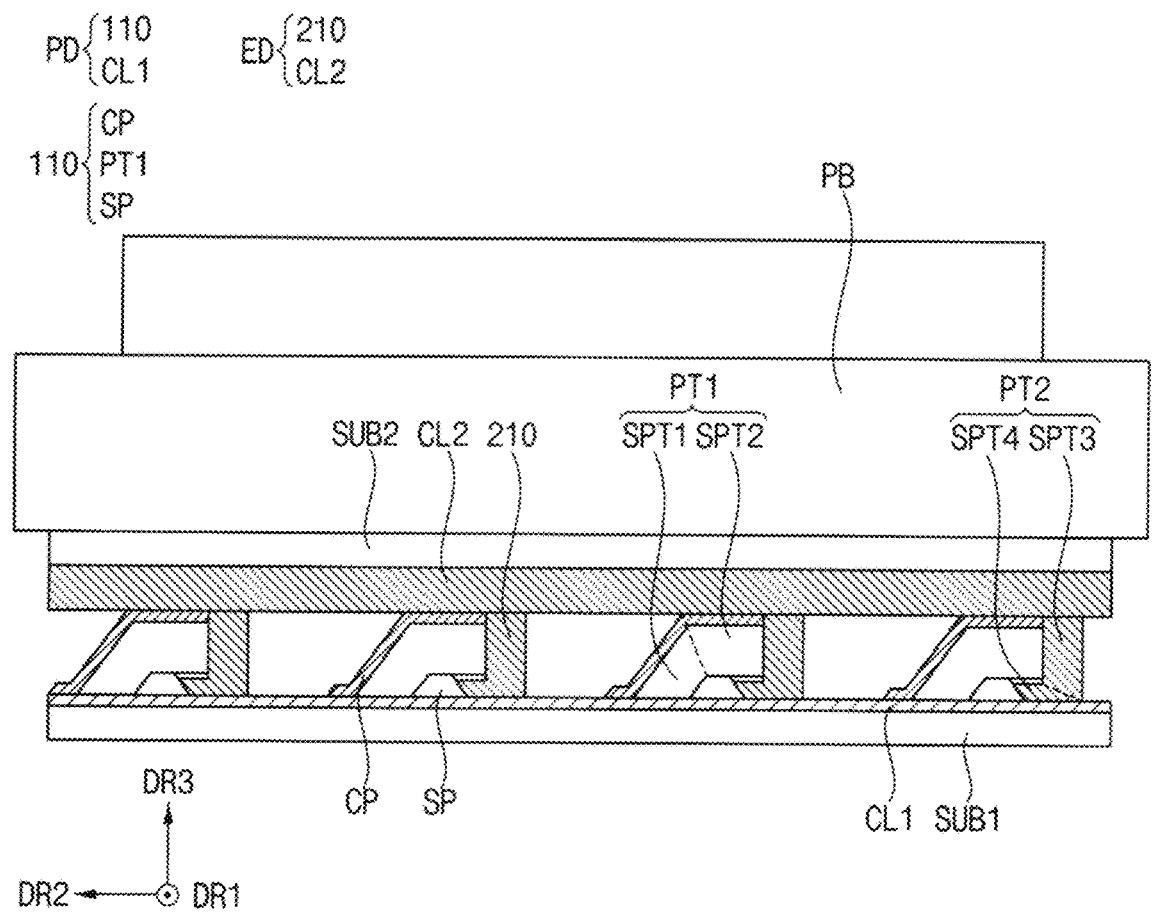
Figure 23:
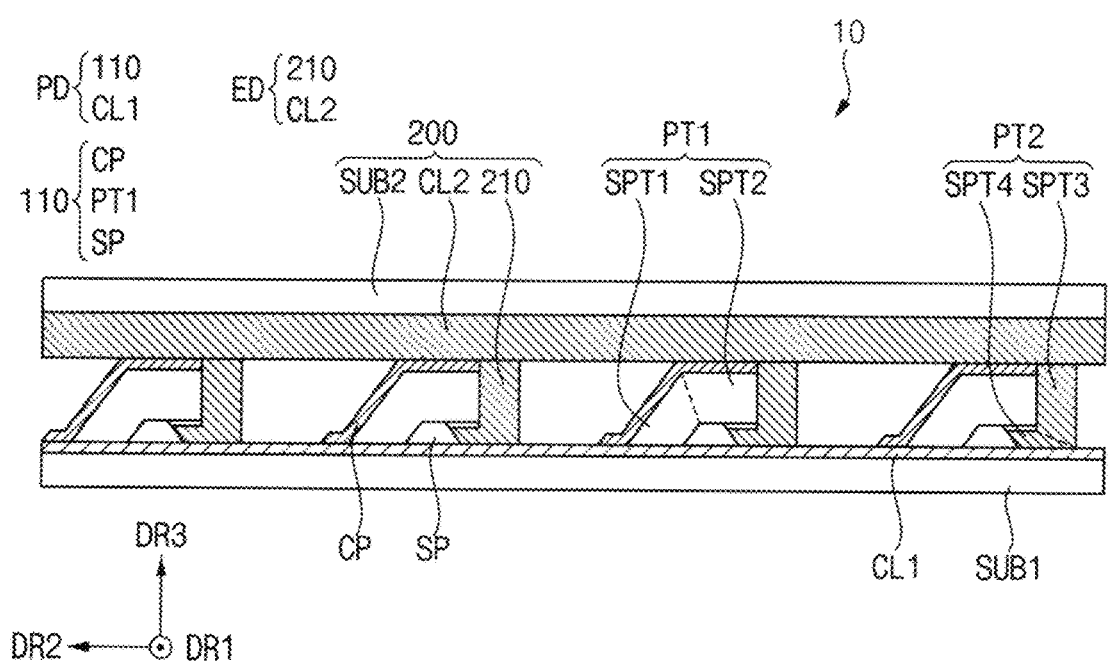

Referring to FIGS. 13 and 14, a preliminary conductive pattern PCP may be formed on the first conductive layer CL1 to cover the support pattern SP and the first pattern PT1. The preliminary conductive pattern PCP may be patterned to form a conductive pattern CP. The conductive pattern CP may make contact with a top surface of the first pattern PT1. One end of the conductive pattern CP may make contact with the first conductive layer CL1.

As a result, the support pattern SP, the first pattern PT1, and the conductive pattern CP may form a first coupling part 110. At least one first coupling part 110 may be formed. The first coupling part 110 and the first conductive layer CL1 may form a pad PD. The pad PD and the first substrate SUB1 may form a display panel 100.

Referring to FIGS. 15 to 18, a second substrate SUB2 may be provided. A second conductive layer CL2 may be formed under the second substrate SUB2. Masks MA may be disposed under the second conductive layer CL2. A second preliminary pattern PPT2 may be formed on a bottom surface of the second conductive layer CL2 except for the masks MA. The second preliminary pattern PPT2 may be patterned to form a second pattern PT2. The second pattern PT2 may include a third sub-pattern SPT3 protruding from the second conductive layer CL2, and a fourth sub-pattern SPT4 bent from the third sub-pattern SPT3 and extending in the second direction DR2.

In detail, a side surface SPT3a of the third sub-pattern SPT3 may be located inward in the direction opposite to the second direction DR2 compared to a side surface SPT4a of the fourth sub-pattern SPT4. Therefore, a second trench TR2 may be defined between the fourth sub-pattern SPT4 and the second conductive layer CL2.

As a result, a second coupling part 210 including the second pattern PT2 may be formed. At least one second coupling part 210 may be formed. The second coupling part 210 and the second conductive layer CL2 may form an electrode ED. The electrode ED and the second substrate SUB2 may form a driver 200.

Referring to FIGS. 19 to 23, the driver 200 may be fixed to a pressing bar PB. A resin layer 300 may be formed on the display panel 100. The resin layer 300 may include an insulating material.

The pressing bar PB to which the driver 200 is fixed may move in the first direction DR1. In this case, the second coupling part 210 included in the driver 200 may make contact with the first conductive layer CL1. In addition, the first coupling part 110 included in the display panel 100 may make contact with the second conductive layer CL2. In detail, the conductive pattern CP included in the first coupling part 110 may make contact with the second conductive layer CL2.

Thereafter, the pressing bar PB may move in the second direction DR2. Therefore, the driver 200 may move in the second direction DR2, and the second coupling part 210 of the driver 200 and the first coupling part 110 of the display panel 100 may be coupled to each other.

Thereafter, the pressing bar PB may transmit heat and a pressure to the resin layer 300 through the driver 200, and the resin layer 300 may be cured. The resin layer 300 may be fixed in a state where the driver 200 and the display panel 100 are coupled to each other. When the resin layer 300 is cured, the pressing bar PB may be detached from the driver 200.

According to the method of manufacturing the display device 10 of embodiments of the present disclosure, the driver 200 and the display panel 100 may be coupled to each other through the pressing bar PB. The first coupling part 110 included in the pad PD and the second coupling part 210 included in the electrode ED may be coupled to each other, so that the pad PD and the electrode ED may make direct contact with each other. Therefore, the driver 200 and the display panel 100 may be electrically connected to each other without a short between the electrode and the pad.

The display panel and the display device according to the embodiments may be applied to a display device included in a computer, a notebook, a mobile phone, a smartphone, a smart pad, a PMP, a PDA, an MP3 player, or the like.

Although display panel and the display device according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display panel comprising:
a first substrate; and
a pad including a first conductive layer and a first coupling part,
wherein the first conductive layer is disposed on the first substrate, and the first coupling part includes a first pattern protruding from the first conductive layer and having a bent shape,
wherein the first pattern includes a first sub-pattern directly protruding from the first conductive layer in an inclined direction from a major surface plane of the first substrate and a second sub-pattern bent from the first sub-pattern,
wherein the first coupling part further includes a support pattern of which top surface directly contacts the second sub-pattern and of which bottom surface directly contacts the first conductive layer such that the support pattern, the second sub-pattern and the first conductive layer define together a trench recessed in a direction parallel to the major surface plane.

2. The display panel of claim 1, wherein a side surface of the support pattern is located inward compared to a side surface of the second sub-pattern.

3. The display panel of claim 1, wherein the first coupling part further includes a conductive pattern disposed on the first pattern.

4. The display panel of claim 1, wherein the first pattern includes an insulating material.

5. The display panel of claim 1, wherein the first pattern includes a plurality of layers which are stacked.

6. An electric device comprising:
a display panel including a first substrate and a pad, wherein the pad includes a first conductive layer disposed on the first substrate, and a first coupling part including a first pattern protruding from the first conductive layer and having a bent shape;
a driver disposed on the display panel and including a second substrate facing the first substrate, and an electrode, wherein the electrode includes a second conductive layer disposed under the second substrate, and a second coupling part including a second pattern protruding from the second conductive layer and having a bent shape; and
a resin layer disposed between the display panel and the driver.

7. The electric device of claim 6, wherein the first pattern includes a first sub-pattern protruding from the first conductive layer and a second sub-pattern bent from the first sub-pattern.

8. The electric device of claim 7, wherein the first coupling part further includes a support pattern disposed between the first pattern and the first conductive layer.

9. The electric device of claim 8, wherein a side surface of the support pattern is located inward compared to a side surface of the second sub-pattern.

10. The electric device of claim 7, wherein the second pattern includes a third sub-pattern protruding from the second conductive layer and a fourth sub-pattern bent from the third sub-pattern.

11. The electric device of claim 10, wherein the first coupling part further includes a conductive pattern disposed on the first pattern.

12. The electric device of claim 11, wherein a sum of a thickness of the second sub-pattern and a thickness of the conductive pattern is less than or equal to a distance between the second conductive layer and the fourth sub-pattern in a thickness direction.

13. The electric device of claim 10, wherein a thickness of the fourth sub-pattern is less than or equal to a distance between the first conductive layer and the second sub-pattern in a thickness direction.

14. The electric device of claim 6, wherein the first coupling part makes contact with the second conductive layer.

15. The electric device of claim 6, wherein the second coupling part makes contact with the first conductive layer.

16. The electric device of claim 6, wherein the driver includes an IC driving chip.

17. The electric device of claim 6, wherein the driver includes a printed circuit board.

18. The electric device of claim 6, wherein the resin layer includes an insulating material.

\* \* \* \* \*